(12) United States Patent
Kundu et al.

(10) Patent No.: US 11,280,847 B1
(45) Date of Patent: Mar. 22, 2022

(54) CIRCUIT, SEMICONDUCTOR DEVICE AND METHOD FOR PARAMETER PSRR MEASUREMENT

(71) Applicant: TAIWAN SEMICONDUCTOR MANUFACTURING COMPANY LTD., Hsinchu (TW)

(72) Inventors: Amit Kundu, Hsinchu (TW);
Jaw-Juinn Horng, Hsinchu (TW);
Yi-Hsiang Wang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/085,189

(22) Filed: Oct. 30, 2020

(51) Int. Cl.
*G01R 31/40* (2020.01)

(52) U.S. Cl.
CPC .................................. *G01R 31/40* (2013.01)

(58) Field of Classification Search
CPC ....................................................... G01R 31/40
USPC ................... 324/764.01, 537, 500
See application file for complete search history.

(56) References Cited

U.S. PATENT DOCUMENTS

| | | | |
|---|---|---|---|
| 2011/0180693 A1* | 7/2011 | Ritter | G01J 9/00 250/214 A |
| 2015/0123628 A1* | 5/2015 | Bhattad | G05F 1/575 323/266 |
| 2019/0129458 A1* | 5/2019 | Wang | G05F 1/595 |
| 2021/0081574 A1* | 3/2021 | Chowdhury | G06N 20/00 |
| 2021/0103308 A1* | 4/2021 | Liu | G05F 1/563 |
| 2021/0216092 A1* | 7/2021 | Chang | G05F 1/614 |

* cited by examiner

*Primary Examiner* — Giovanni Astacio-Oquendo
(74) *Attorney, Agent, or Firm* — WPAT, P.C., Intellectual Property Attorneys; Anthony King

(57) ABSTRACT

A circuit for parameter PSRR measurement includes a filter, a first regulator and a second regulator. The filter may be configured for receiving an AC input signal and a DC input signal, and for outputting a combined output signal according to the AC input signal and the DC input signal. The first regulator may be configured for receiving the combined output signal, and for outputting a first output signal having a first AC component signal and a first DC component signal. The second regulator may be configured for receiving the first output signal, and for outputting a second output signal having a second AC component signal and a second DC component signal. A parameter PSRR of the second regulator may be obtained according to the first AC component signal and the second AC component signal.

20 Claims, 8 Drawing Sheets

CIRCUIT, SEMICONDUCTOR DEVICE AND METHOD FOR PARAMETER PSRR MEASUREMENT

BACKGROUND

In electronic systems, power supply rejection ratio (PSRR) is a parameter widely used to describe the capability of an electronic circuit to suppress any power supply variations to its output signal. Recent customer requests have shown that they tend to have fast measurement "on-die parameter" ODP monitor circuits for probing and characterizing major analog circuit for each chip. However, on-die regulator PSRR measurement & debugging for wide-frequency range and high load current is difficult to achieve using the conventional methods and circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
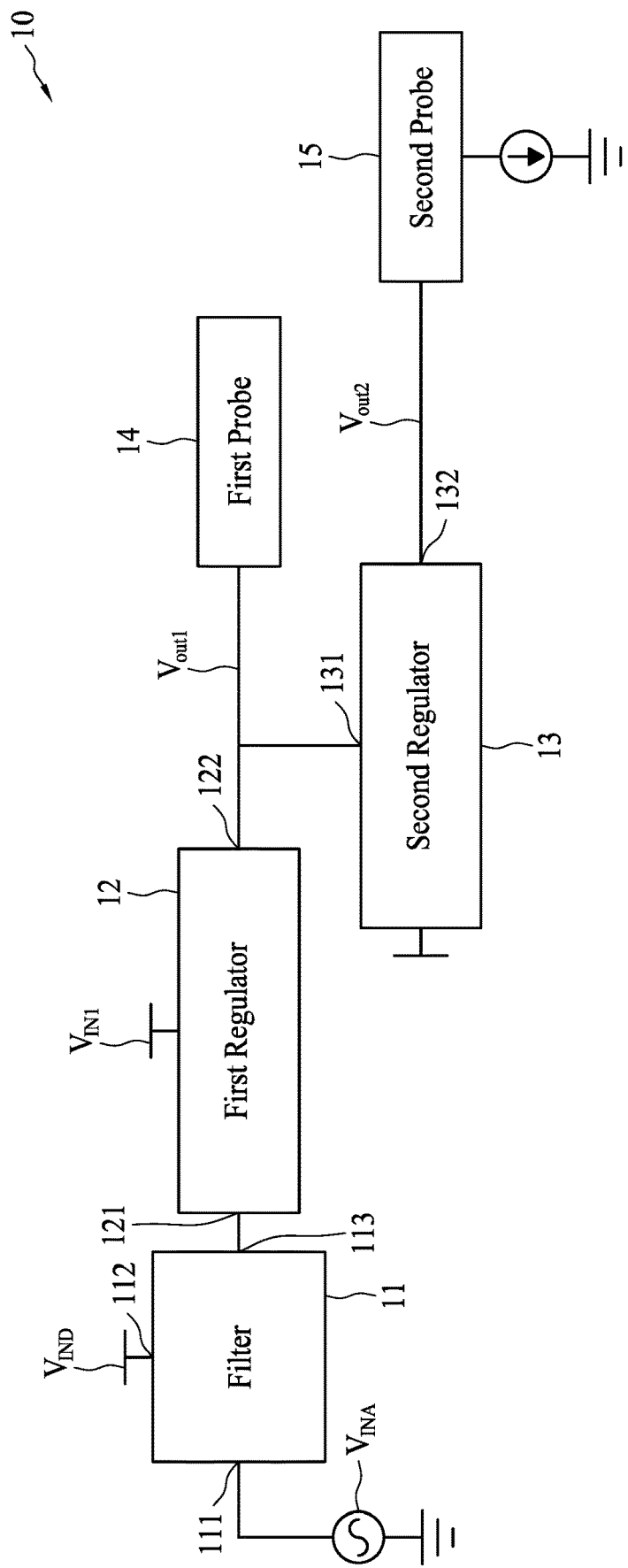
FIG. 1 illustrates a circuit for parameter PSRR measurement in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Referring to the figures, wherein like numerals indicate like parts throughout the several views. FIG. 1 illustrates a circuit for parameter PSRR measurement in accordance with some embodiments of the present disclosure. Referring to FIG. 1, a circuit 10 for parameter PSRR (Power Supply Rejection Ratio) measurement includes a filter 11, a first regulator 12 and a second regulator 13. The circuit 10 may be configured to achieve PSRR measurement, and may be implemented as "on-die parameter" (ODP) measurement.

In accordance with some embodiments of the present disclosure, the filter 11 has an AC signal input terminal 111, a DC signal input terminal 112 and a combined signal output terminal 113. The AC signal input terminal 111 may be configured for receiving an AC input signal $V_{INA}$. The DC signal input terminal 112 may be configured for receiving a DC input signal $V_{IND}$. The combined signal output terminal 113 may be configured for outputting a combined output signal according to the AC input signal 114 and the DC input signal $V_{outc}$.

In accordance with some embodiments of the present disclosure, the first regulator 12 has a first input terminal 121 and a first output terminal 122. The first input terminal 121 may be coupled to the combined signal output terminal 113, and may be configured for receiving the combined output signal $V_{outc}$. Thus, the combined output signal $V_{outc}$ may be inputted to the first regulator 12. The first output terminal 122 may be configured for outputting a first output signal $V_{out1}$. The first output signal $V_{out1}$ has a first AC component signal $V_{AC1}$ and a first DC component signal $V_{DC1}$. The first output signal $V_{out1}$ may be obtained according to the combined output signal $V_{outc}$. Therefore, the first output signal $V_{out1}$ may be adjusted according to the combined output signal $V_{outc}$, for example, the first AC component signal $V_{AC1}$ may be adjusted according to the AC input signal $V_{INA}$, and the first DC component signal $V_{DC1}$ may be adjusted according to the DC input signal $V_{IND}$.

In accordance with some embodiments of the present disclosure, the first regulator 12 may receive a DC power signal $V_{IN1}$. Therefore, the first output signal $V_{out1}$ may be adjusted according to the combined output signal $V_{outc}$ and DC power signal $V_{IN1}$, for example, the first AC component signal $V_{AC1}$ may be adjusted according to the AC input signal $V_{INA}$, and the first DC component signal $V_{DC1}$ may be adjusted according to the DC input signal $V_{IND}$ and the DC power signal $V_{IN1}$.

In accordance with some embodiments of the present disclosure, a first probe 14 may be configured to measure the first output signal $V_{out1}$. Furthermore, the first AC component signal $V_{AC1}$ of the first output signal $V_{out1}$ and the first DC component signal $V_{DC1}$ of the first output signal $V_{out1}$ may be separated from the first output signal $V_{out1}$, or the first AC component signal $V_{AC1}$ of the first output signal $V_{out1}$ and the first DC component signal $V_{DC1}$ of the first output signal $V_{out1}$ may be obtained from the first output signal $V_{out1}$. Therefore, the first output signal $V_{out1}$ may be monitored and quantified by the first probe 14.

In accordance with some embodiments of the present disclosure, the second regulator 13 has a second input terminal 131 and a second output terminal 132. The second input terminal 131 may be coupled to the first output terminal 122, and may be configured for receiving the first output signal $V_{out1}$. Thus, the first output signal $V_{out1}$ may be inputted to the second regulator 13. The second output terminal 132 may be configured for outputting a second output signal $V_{out2}$. The second output signal $V_{out2}$ has a second AC component signal $V_{AC2}$ and a second DC component signal $V_{DC2}$. The second output signal $V_{out2}$ may be obtained according to the first output signal $V_{out1}$. Therefore, the second output signal $V_{out2}$ may be adjusted according to the first output signal $V_{out1}$, for example, the second AC component signal $V_{AC2}$ may be adjusted according to the first AC component signal $V_{AC1}$, and the second DC component signal $V_{DC2}$ may be adjusted according to the first DC component signal $V_{DC1}$.

In accordance with some embodiments of the present disclosure, a second probe 15 may be configured to measure the second output signal $V_{out2}$, and the second AC component signal $V_{AC2}$ of the second output signal $V_{out2}$ and the second DC component signal $V_{DC2}$ of the second output signal $V_{out2}$ may be separated from the second output signal $V_{out2}$, or the second AC component signal $V_{AC2}$ of the second output signal $V_{out2}$ and the second DC component signal $V_{DC2}$ of the second output signal $V_{out2}$ may be obtained from the second output signal $V_{out2}$. Therefore, the second output signal $V_{out2}$ may be monitored and quantified by the second probe 15.

In accordance with some embodiments of the present disclosure, a parameter PSRR of the second regulator 13 may be obtained according to the first AC component signal $V_{AC1}$ and the second AC component signal $V_{AC2}$. That is, the PSRR of the second regulator 13 may be expressed as: $PSRR=20*\log(V_{AC2}/V_{AC1})$.

In accordance with some embodiments of the present disclosure, the first regulator 12 may be configured to combine the first AC component signal $V_{AC1}$ and the first DC component signal $V_{DC1}$ and to provide the signals to a DC power signal terminal (the second input terminal 131) of the second regulator 13. Therefore, the first regulator 12 may support high output current and prevent loading to the second regulator 13. Furthermore, no redesign required, since both the first regulator 12 and the second regulator 13 may have the same design. Besides, reliability issue for the first regulator 12 may be negligible in case it is core device design.

Figure 2:
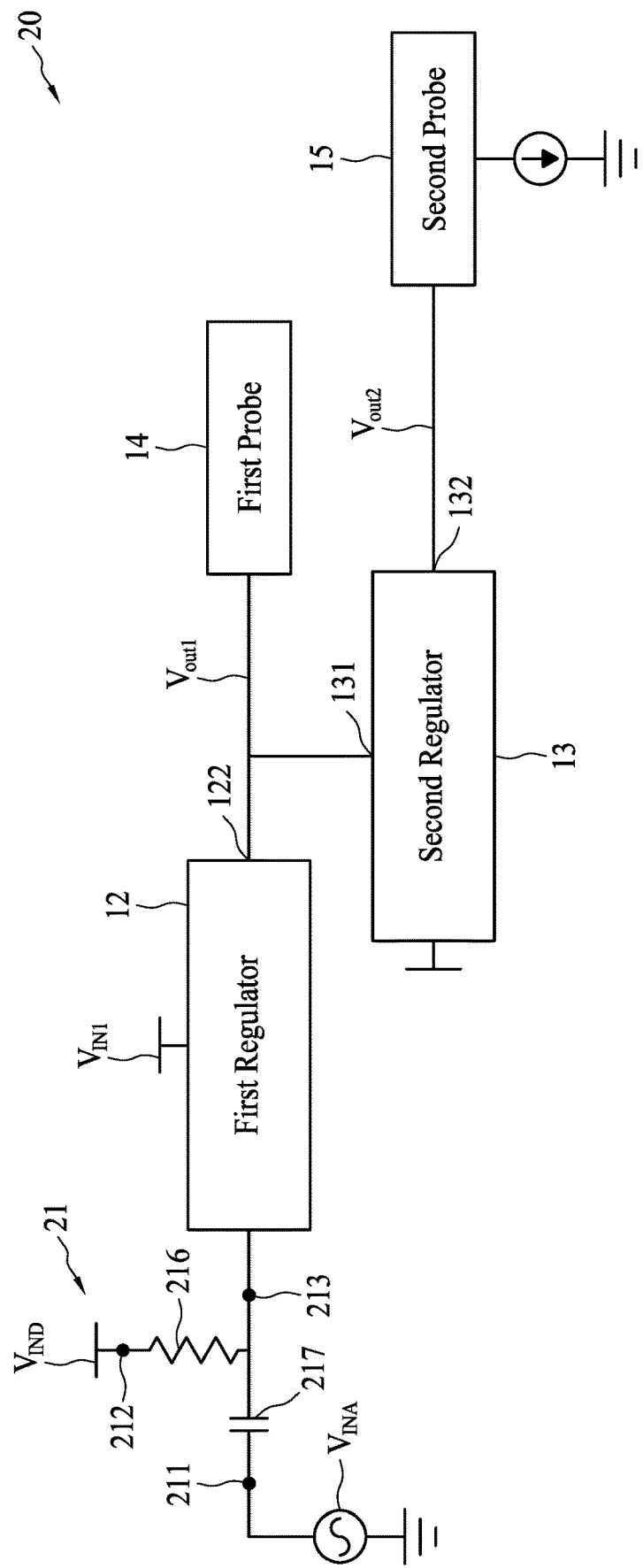
FIG. 2 illustrates a circuit for parameter PSRR measurement in accordance with some embodiments of the present disclosure.

FIG. 2 illustrates a circuit for parameter PSRR measurement in accordance with some embodiments of the present disclosure. Referring to FIG. 2, a circuit 20 for parameter PSRR measurement includes a filter 21, a first regulator 12 and a second regulator 13.

In accordance with some embodiments of the present disclosure, the filter 21 has an AC signal input terminal 211, a DC signal input terminal 212 and a combined signal output terminal 213. The AC signal input terminal 211 may be configured for receiving an AC input signal $V_{INA}$. The DC signal input terminal 212 may be configured for receiving a DC input signal $V_{IND}$. The combined signal output terminal 213 may be configured for outputting a combined output signal $V_{outc}$ according to the AC input signal $V_{INA}$ and the DC input signal $V_{IND}$.

In accordance with some embodiments of the present disclosure, the filter 21 includes a resister 216 and a capacitor 217. The resister 216 may be coupled to the capacitor 217, the combined signal output terminal 213 and the DC signal input terminal 212. That is, one end of the resister 216 may be coupled to the DC signal input terminal 212, and the other end of the resister 216 may be coupled to the capacitor 217 and the combined signal output terminal 213. The capacitor 217 may be coupled to the resister 216, the combined signal output terminal 213 and the AC signal input terminal 211. That is, one end of the capacitor 217 may be coupled to the AC signal input terminal 211, and the other end of the capacitor 217 may be coupled to the resister 216 and the combined signal output terminal 213.

In accordance with some embodiments of the present disclosure, since the resister 216 and the capacitor 217 occupy much smaller area of the chip than other on-chip elements, the resister 216 and the capacitor 217 may be configured to implement on-chip filter. Furthermore, a cut-off frequency of the filter 21 may be low, for example, hundreds of Hz.

Figure 3:
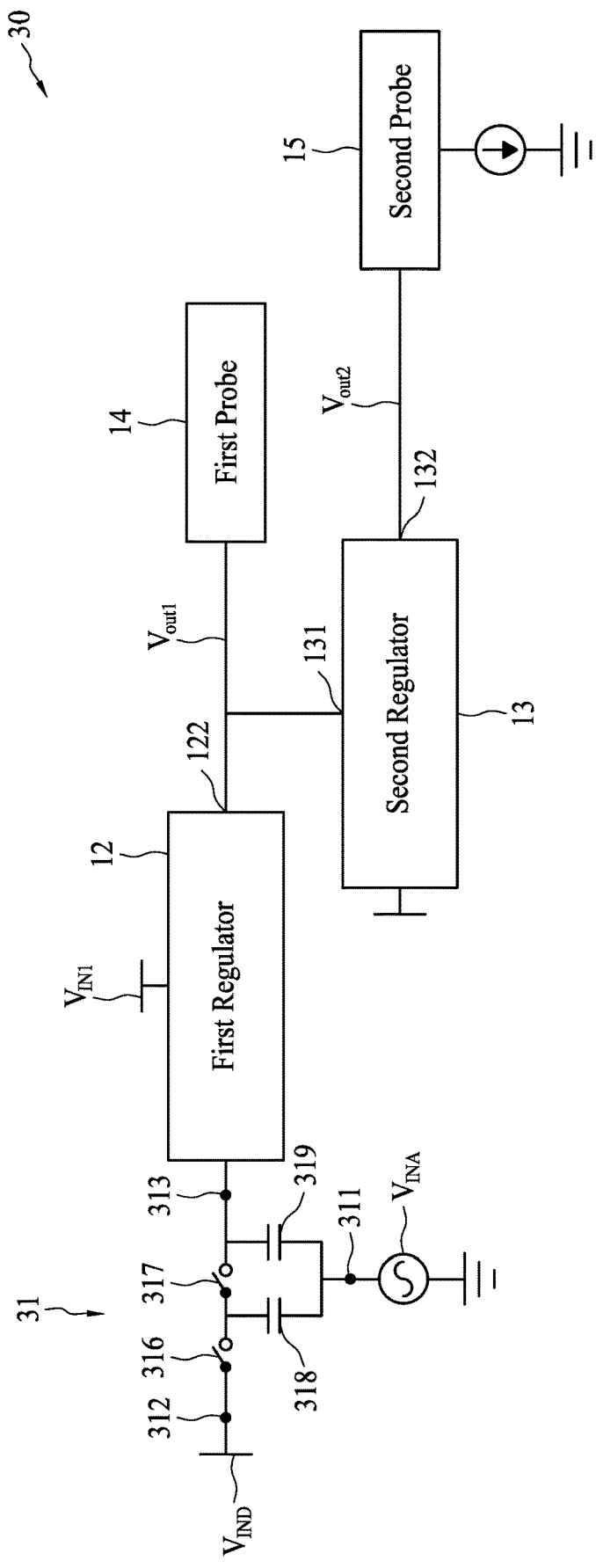
FIG. 3 illustrates a circuit for parameter PSRR measurement in accordance with some embodiments of the present disclosure.

FIG. 3 illustrates a circuit for parameter PSRR measurement in accordance with some embodiments of the present disclosure. Referring to FIG. 3, a circuit 30 for parameter PSRR measurement includes a filter 31, a first regulator 12 and a second regulator 13.

In accordance with some embodiments of the present disclosure, the filter 31 has an AC signal input terminal 311, a DC signal input terminal 312 and a combined signal output terminal 313. The AC signal input terminal 311 may be configured for receiving an AC input signal $V_{INA}$. The DC signal input terminal 312 may be configured for receiving a DC input signal $V_{IND}$. The combined signal output terminal 313 may be configured for outputting a combined output signal $V_{outc}$ according to the AC input signal $V_{INA}$ and the DC input signal $V_{IND}$.

In accordance with some embodiments of the present disclosure, the filter 31 includes a plurality of switches 316, 317 and a plurality of capacitors 318, 319. The switches 316, 317 may be coupled to the capacitors 318, 319, the DC signal input terminal 312 and the combined signal output terminal 313. The capacitors 318, 319 may be coupled to the switches 316, 317, the AC signal input terminal 311 and the combined signal output terminal 313.

In accordance with some embodiments of the present disclosure, the filter 31 has a first switch 316, a second switch 317, a first capacitor 318 and a second capacitor 319. The first switch 316 may be coupled to the first capacitor 318, the second switch 317, and the DC signal input terminal 312. In other words, one end of the first switch 316 may be coupled to the DC signal input terminal 312, and the other end of the first switch 316 may be coupled to the first capacitor 318 and the second switch 317. The second switch 317 may be coupled to the first capacitor 318, the second capacitor 319, the first switch 316 and the combined signal output terminal 313. In other words, one end of the second switch 317 may be coupled to the first switch 316 and the first capacitor 318, and the other end of the second switch 317 may be coupled to the second capacitor 319 and the combined signal output terminal 313. The first capacitor 318 may be coupled to the first switch 316, the second switch 317, the second capacitor 319 and the AC signal input terminal 311. In other words, one end of the first capacitor 318 may be coupled to the first switch 316 and the second switch 317, and the other end of the first capacitor 318 may be coupled to the second capacitor 319 and the AC signal input terminal 311. The second capacitor 319 may be coupled to the second switch 317, the first capacitor 318, the combined signal output terminal 313 and the AC signal input terminal 311. In other words, one end of the second capacitor 319 may be coupled to the second switch 317 and the combined signal output terminal 313, and the other end of the second capacitor 319 may be coupled to the first capacitor 318 and the AC signal input terminal 311.

In accordance with some embodiments of the present disclosure, the filter 31 may be an on-chip switch-cap filter, and the switches 316, 317 and the capacitors 318 and 319 occupy much smaller area of the chip than other on-chip elements.

Figure 4:
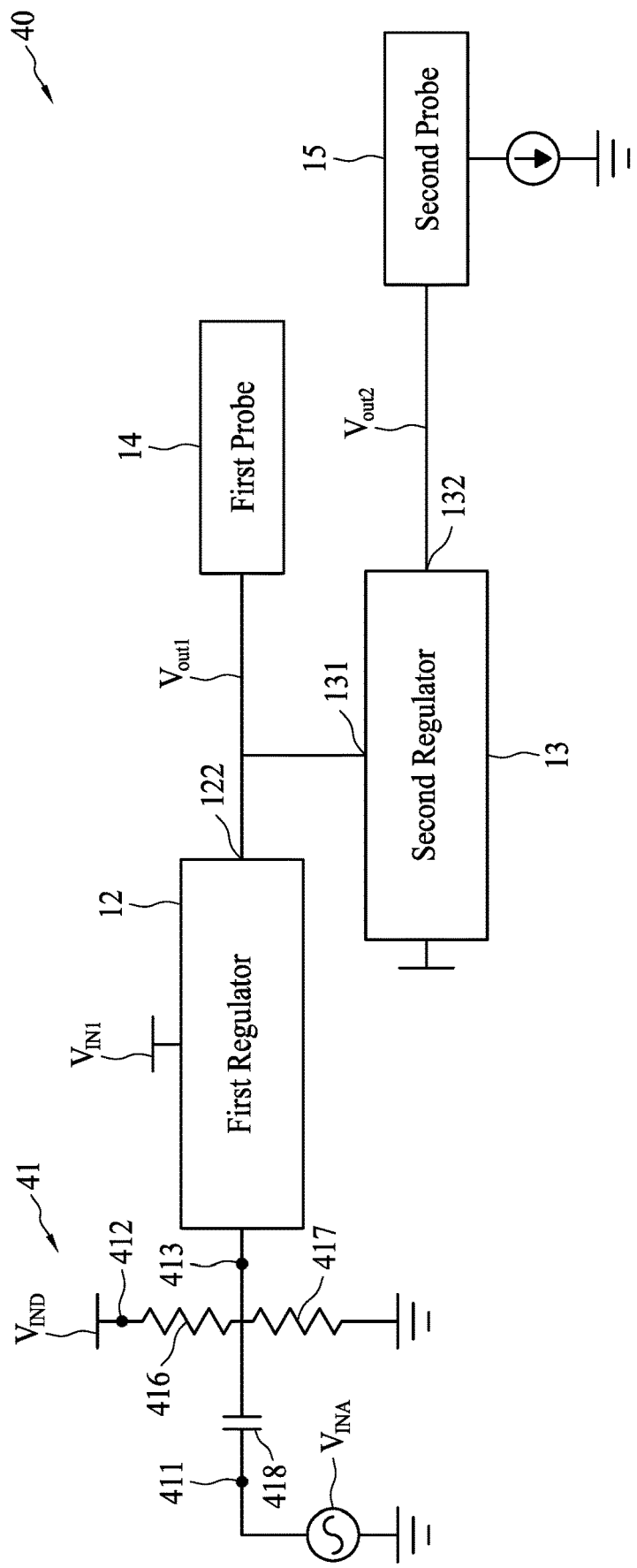
FIG. 4 illustrates a circuit for parameter PSRR measurement in accordance with some embodiments of the present disclosure.

FIG. 4 illustrates a circuit for parameter PSRR measurement in accordance with some embodiments of the present disclosure. Referring to FIG. 4, a circuit 40 for parameter PSRR measurement includes a filter 41, a first regulator 12 and a second regulator 13.

In accordance with some embodiments of the present disclosure, the filter 41 has an AC signal input terminal 411, a DC signal input terminal 412 and a combined signal output terminal 413. The AC signal input terminal 411 may be configured for receiving an AC input signal $V_{INA}$. The DC signal input terminal 412 may be configured for receiving a DC input signal $V_{IND}$. The combined signal output terminal 413 may be configured for outputting a combined output signal $V_{outc}$ according to the AC input signal $V_{INA}$ and the DC input signal $V_{IND}$.

In accordance with some embodiments of the present disclosure, the filter 41 includes a first resister 416, a second resister 417 and a capacitor 418. The first resister 416 may be coupled to the capacitor 418, the second resister 417, the combined signal output terminal 413 and the DC signal input terminal 412. In other words, one end of the first resister 416 may be coupled to the DC signal input terminal 412, and the other end of the first resister 416 may be coupled to the capacitor 418, the second resister 417 and the combined signal output terminal 413. The second resister 417 may be coupled to the capacitor 418, the first resister 416, the combined signal output terminal 413 and a ground. In other words, one end of the second resister 417 may be coupled to the capacitor 418, the first resister 416 and the combined signal output terminal 413, and the other end of the second resister 417 may be coupled to the ground. The capacitor 418 may be coupled to the first resister 416, the second resister 417, the combined signal output terminal 413 and the AC signal input terminal 411. In other words, one end of the capacitor 418 may be coupled to the AC signal input terminal 411, and the other end of the capacitor 418 may be coupled to the first resister 416, the second resister 417 and the combined signal output terminal 413.

In accordance with some embodiments of the present disclosure, since the resisters 416, 417 and the capacitor 418 occupy much smaller area of the chip than other on-chip elements, the resisters 416, 417 and the capacitor 418 may be configured to implement on-chip filter. Furthermore, the resisters 416, 417 and the capacitor 418 may be configured to implement off-chip filter.

Figure 5:
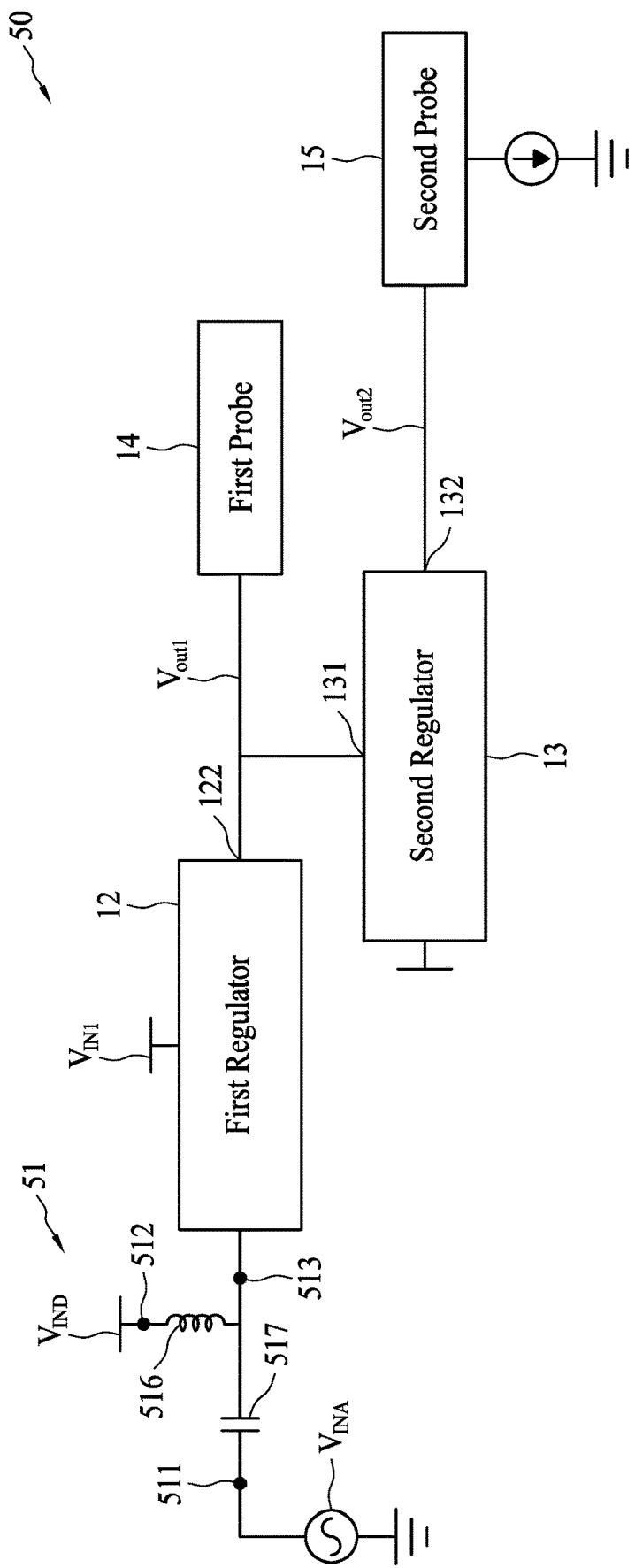
FIG. 5 illustrates a circuit for parameter PSRR measurement in accordance with some embodiments of the present disclosure.

FIG. 5 illustrates a circuit for parameter PSRR measurement in accordance with some embodiments of the present disclosure. Referring to FIG. 5, a circuit 50 for parameter PSRR measurement includes a filter 51, a first regulator 12 and a second regulator 13.

In accordance with some embodiments of the present disclosure, the filter 51 has an AC signal input terminal 511, a DC signal input terminal 512 and a combined signal output terminal 513. The AC signal input terminal 511 may be configured for receiving an AC input signal $V_{INA}$. The DC signal input terminal 512 may be configured for receiving a DC input signal $V_{IND}$. The combined signal output terminal 513 may be configured for outputting a combined output signal $V_{outc}$ according to the AC input signal $V_{INA}$ and the DC input signal $V_{IND}$.

In accordance with some embodiments of the present disclosure, the filter 51 includes an inductor 516 and a capacitor 517. The inductor 516 may be coupled to the capacitor 517, the combined signal output terminal 513 and the DC signal input terminal 512. That is, one end of the inductor 516 may be coupled to the DC signal input terminal 512, and the other end of the inductor 516 may be coupled to the capacitor 517 and the combined signal output terminal 513. The capacitor 517 may be coupled to the inductor 516, the combined signal output terminal 513 and the AC signal input terminal 511. That is, one end of the capacitor 517 may be coupled to the AC signal input terminal 511, and the other end of the capacitor 517 may be coupled to the inductor 516 and the combined signal output terminal 513.

In accordance with some embodiments of the present disclosure, the inductor 516 and the capacitor 517 may be configured to implement on-chip filter. Furthermore, the inductor 516 and the capacitor 517 may be configured to implement off-chip filter.

Figure 6:
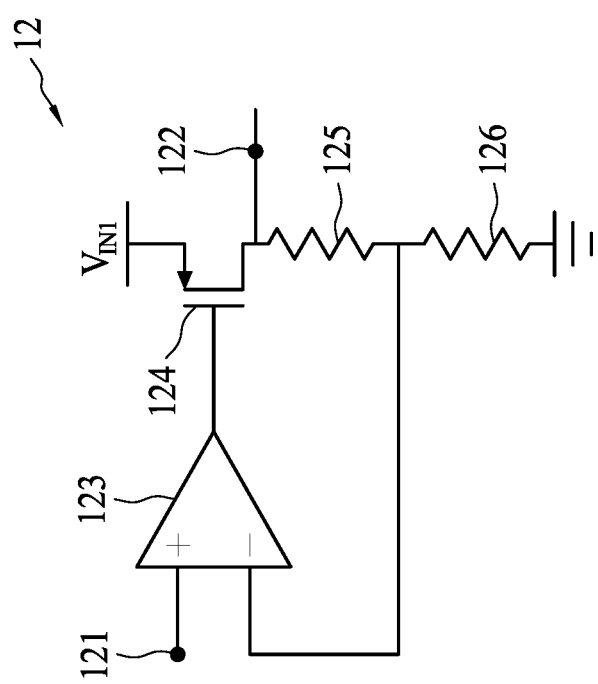
FIG. 6 illustrates a regulator in accordance with some embodiments of the present disclosure.

FIG. 6 illustrates a regulator in accordance with some embodiments of the present disclosure. Referring to FIG. 1 and FIG. 6, the first regulator 12 has a first input terminal 121 and a first output terminal 122. Furthermore, the first regulator 12 may include an operational amplifier 123, a transistor 124 and resisters 125, 126. In accordance with some embodiments of the present disclosure, the operational amplifier 123 drives the transistor 124 with more current if the voltage at its inverting input terminal drops below the output of the voltage reference at the first input terminal 121 (the non-inverting input terminal). The resisters 125, 126 may be configured to adjust the first output signal $V_{out1}$. In accordance with some embodiments of the present disclosure, the first regulator 12 may be a linear regulator, a switching regulator, linear voltage regulator (LVR), a low drop-out regulator (LDO). Furthermore, in accordance with some embodiments of the present disclosure, the second regulator 13 may be a linear regulator, a switching regulator, linear voltage regulator (LVR), a low drop-out regulator (LDO). The first regulator 12 may be the same as the second regulator 13.

Figures 7, 8:
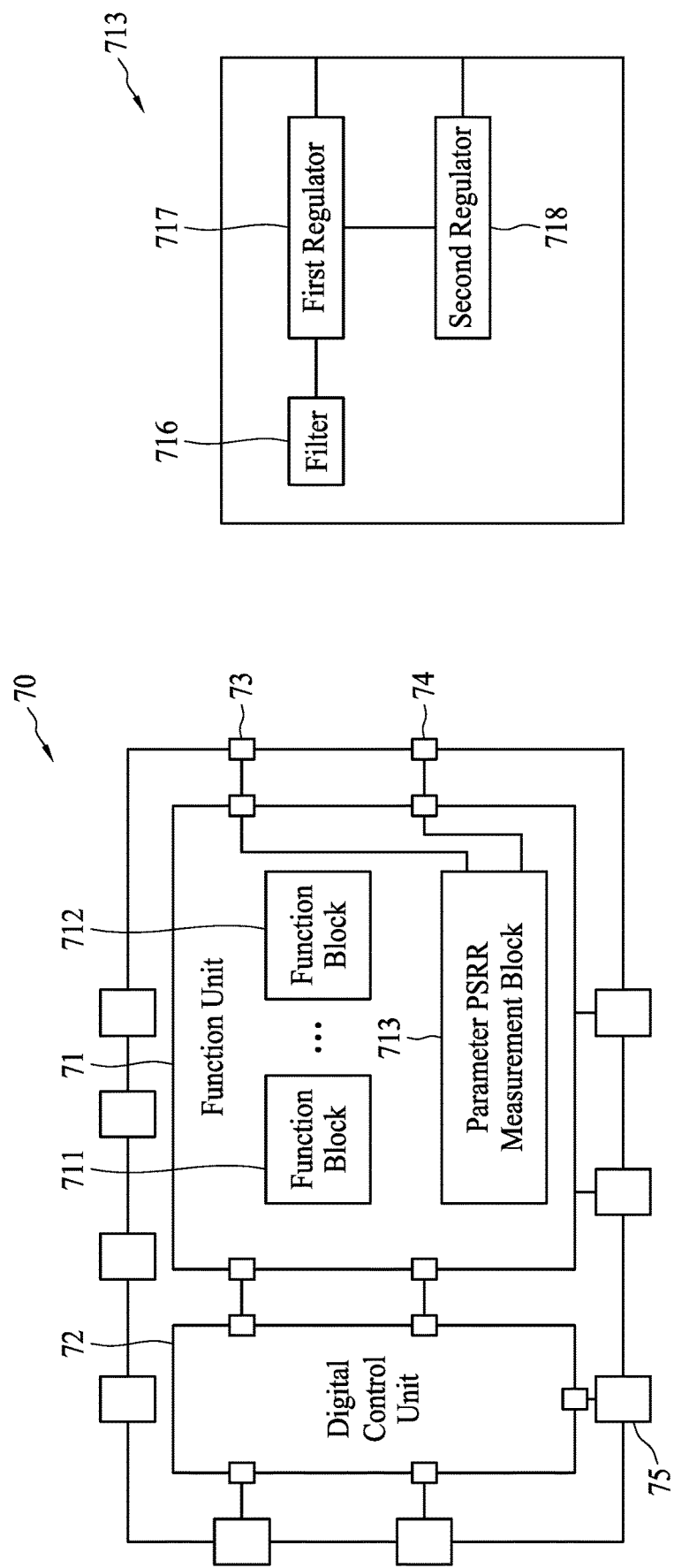
FIG. 7 illustrates a semiconductor device for parameter PSRR measurement in accordance with some embodiments of the present disclosure.
FIG. 8 illustrates a function unit for parameter PSRR measurement in accordance with some embodiments of the present disclosure.

FIG. 7 illustrates a semiconductor device for parameter PSRR measurement in accordance with some embodiments of the present disclosure. FIG. 8 illustrates a function unit for parameter PSRR measurement in accordance with some embodiments of the present disclosure. Referring to FIG. 7 and FIG. 8, a semiconductor device 70 for parameter PSRR measurement includes a function unit 71 and a digital control unit 72. The function unit 71 has at least one function block 711, 712 and a parameter PSRR measurement block 713. The parameter PSRR measurement block 713 may be easily incorporated within on-die parameter (ODP) circuit for product level monitoring. Furthermore, the parameter PSRR measurement block 713 may incorporate various function blocks (MOS Id/Vth monitoring, passives, RO, analog building blocks) to form the function unit 71.

In accordance with some embodiments of the present disclosure, the parameter PSRR measurement block 713 includes a filter 716, a first regulator 717 and a second regulator 718. Referring to FIG. 1 and FIG. 8, the filter 716 in FIG. 8 may be the same as the filter 11 in FIG. 1, the first regulator 717 in FIG. 8 may be the same as the first regulator 12 in FIG. 1, and the second regulator 718 in FIG. 8 may be the same as the second regulator 13 in FIG. 1. The filter 716 may be configured for receiving an AC input signal $V_{INA}$ and a DC input signal $V_{IND}$, and for outputting a combined output signal $V_{outc}$ according to the AC input signal $V_{INA}$ and the DC input signal $V_{IND}$. The first regulator 717 may be coupled to the filter 716, and may be configured for receiving the combined output signal $V_{outc}$, and for outputting a first output signal $V_{out1}$. The first output signal $V_{out1}$ has a first AC component signal $V_{AC1}$ and a first DC component signal $V_{DC1}$. The first output signal $V_{out1}$ may be obtained according to the combined output signal $V_{outc}$. Therefore, the first output signal $V_{out1}$ may be adjusted according to the combined output signal $V_{outc}$, for example, the first AC component signal $V_{AC1}$ may be adjusted according to the AC input signal $V_{INA}$, and the first DC component signal $V_{DC1}$ may be adjusted according to the DC input signal $V_{IND}$.

In accordance with some embodiments of the present disclosure, the second regulator 718 may be coupled to the first regulator 717, and may be configured for receiving the first output signal $V_{out1}$, and for outputting a second output signal $V_{out2}$. The second output signal $V_{out2}$ has a second AC component signal $V_{AC2}$ and a second DC component signal $V_{DC2}$. The second output signal $V_{out2}$ may be obtained according to the first output signal $V_{out1}$. Therefore, the second output signal $V_{out2}$ may be adjusted according to the first output signal $V_{out1}$, for example, the second AC component signal $V_{AC2}$ may be adjusted according to the first AC component signal $V_{AC1}$, and the second DC component signal $V_{DC2}$ may be adjusted according to the first DC component signal $V_{DC1}$. A parameter PSRR of the second regulator 718 may be obtained according to the first AC component signal $V_{AC1}$ and the second AC component signal $V_{AC2}$.

In accordance with some embodiments of the present disclosure, the semiconductor device 70 further includes a first output pin 73 and a second output pin 74. The first output pin may be configured for outputting the first output signal $V_{out1}$, and the second output pin 74 may be configured for outputting the second output signal $V_{out2}$.

In accordance with some embodiments of the present disclosure, the first probe 14 may be configured to measure the first output signal $V_{out1}$, and the second probe 15 may be configured to measure the second output signal $V_{out2}$.

In accordance with some embodiments of the present disclosure, the digital control unit 72 may be coupled to the function unit 71, and may be configured for selecting at least one function block 711, 712 or the parameter PSRR measurement block 713. The semiconductor device 70 further includes a selecting pin 75 for selecting at least one function block 711, 712 or the parameter PSRR measurement block 713. The digital control unit 72 may be a multiplexer. Therefore, the required block may be selected by the digital control unit 72, and a predetermined measurement SOP may be followed using automation for measuring all dies.

In accordance with some embodiments of the present disclosure, referring to FIG. 2 and FIG. 8, the filter 716 in FIG. 8 may be the same as the filter 21 in FIG. 2. The filter 716 may include a resister and a capacitor, the resister may be coupled to the capacitor.

In accordance with some embodiments of the present disclosure, referring to FIG. 3 and FIG. 8, the filter 716 in FIG. 8 may be the same as the filter 31 in FIG. 2. The filter 716 may include a plurality of switches and a plurality of capacitors, the switches may be coupled to the capacitors. The filter 716 may include a first switch, a second switch, a first capacitor and a second capacitor. The first switch may be coupled to the first capacitor, and the second switch. The second switch may be coupled to the first capacitor, the second capacitor, and the first switch. The first capacitor may be coupled to the first switch, the second switch, and the second capacitor. The second capacitor may be coupled to the second switch, and the first capacitor.

In accordance with some embodiments of the present disclosure, referring to FIG. 4 and FIG. 8, the filter 716 in FIG. 8 may be the same as the filter 41 in FIG. 2. The filter 716 may include a first resister, a second resister and a capacitor. The first resister may be coupled to the capacitor, and the second resister. The second resister may be coupled to the capacitor, and the first resister. The capacitor may be coupled to the first resister, the second resister.

In accordance with some embodiments of the present disclosure, referring to FIG. 5 and FIG. 8, the filter 716 in FIG. 8 may be the same as the filter 51 in FIG. 2. The filter 716 may include an inductor and a capacitor, the inductor may be coupled to the capacitor.

In accordance with some embodiments of the present disclosure, the semiconductor device 70 may be able to implement on-die parameter PSRR measurement without external components or the conventional line injector circuit. Therefore, problems, for example de-embedding noise from PCB and testing environment, arising due to external components may be mitigated. Furthermore, using two regulators may minimize additional design efforts required by circuit designer, and programmable & fast measurements may be done for all dies. Besides, easy debugging for regulators may be performed in testchip analog IPs.

Figure 9:
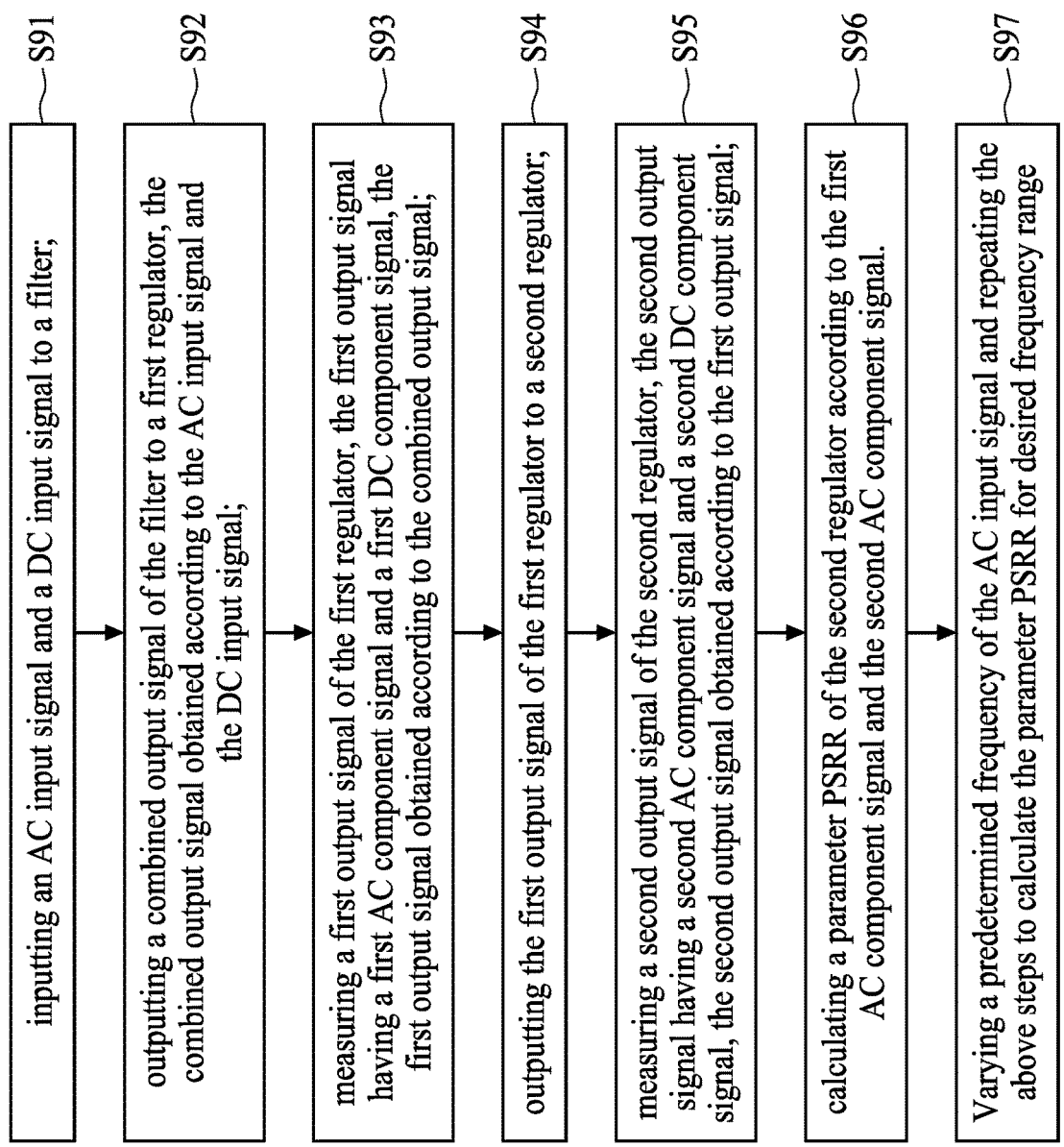
FIG. 9 is a flow diagram showing a method for parameter PSRR measurement in accordance with some embodiments of the present disclosure.

FIG. 9 is a flow diagram showing a method for parameter PSRR measurement in accordance with some embodiments of the present disclosure. Referring to FIG. 1 and FIG. 9, in step S91, an AC input signal $V_{INA}$ and a DC input signal $V_{IND}$ are inputting to a filter 11.

In step S92, a combined output signal $V_{outc}$ of the filter 11 is outputting to a first regulator 12, and the combined output signal $V_{outc}$ may be obtained according to the AC input signal $V_{IN4}$ and the DC input signal $V_{IND}$.

In step S93, a first output signal $V_{out1}$ of the first regulator 12 is measuring, the first output signal $V_{out1}$ has a first AC component signal $V_{AC1}$ and a first DC component signal $V_{DC1}$, and the first output signal $V_{out1}$ may be obtained according to the combined output signal $V_{outc}$.

In step S94, the first output signal $V_{out1}$ of the first regulator 12 is outputting to a second regulator 13.

In step S95, a second output signal $V_{out2}$ of the second regulator 13 is measuring, the second output signal $V_{out2}$ has a second AC component signal $V_{AC2}$ and a second DC component signal $V_{DC2}$, and the second output signal $V_{out2}$ may be obtained according to the first output signal $V_{out1}$.

In step S96, a parameter PSRR of the second regulator 13 is calculated according to the first AC component signal $V_{AC1}$ and the second AC component signal $V_{AC2}$.

In step S97, a predetermined frequency of the AC input signal may be varied, and the above steps may be repeated to calculate the parameter PSRR for desired frequency range. Therefore, the method for parameter PSRR measurement may enable wide-frequency range measurement. Furthermore, the method for parameter PSRR measurement may save testing resources and is a high accuracy monitoring method for process margins in regulators.

In accordance with some embodiments of the present disclosure, the method for parameter PSRR measurement may further include a step of inputting a DC power signal $V_{IN1}$ to the first regulator 12, the first DC component signal $V_{DC1}$ of the first output signal $V_{out1}$ may be obtained according to the DC input signal $V_{IN1}$ and the DC power signal $V_{DC1}$.

In some embodiments, a circuit for parameter PSRR measurement is disclosed, including: a filter, a first regulator and a second regulator. The filter has an AC signal input terminal, a DC signal input terminal and a combined signal output terminal. The AC signal input terminal may be configured for receiving an AC input signal. The DC signal input terminal may be configured for receiving a DC input signal. The combined signal output terminal may be configured for outputting a combined output signal according to the AC input signal and the DC input signal. The first regulator has a first input terminal and a first output terminal. The first input terminal may be coupled to the combined signal output terminal and may be configured for receiving the combined output signal. The first output terminal may be configured for outputting a first output signal. The first output signal has a first AC component signal and a first DC component signal. The first output signal may be obtained according to the combined output signal. The second regulator has a second input terminal and a second output terminal. The second input terminal may be coupled to the first output terminal and may be configured for receiving the first output signal. The second output terminal may be configured for outputting a second output signal. The second output signal has a second AC component signal and a second DC component signal. The second output signal may be obtained according to the first output signal. A parameter PSRR of the second regulator may be obtained according to the first AC component signal and the second AC component signal.

In some embodiments, a semiconductor device for parameter PSRR measurement is disclosed, including: a function unit and a digital control unit. The function unit has at least one function block and a parameter PSRR measurement block. The parameter PSRR measurement block includes a filter, a first regulator and a second regulator. The filter may be configured for receiving an AC input signal and a DC input signal, and may be configured for outputting a combined output signal according to the AC input signal and the DC input signal. The first regulator may be coupled to the filter and may be configured for receiving the combined output signal, and may be configured for outputting a first output signal. The first output signal has a first AC component signal and a first DC component signal. The first output signal may be obtained according to the combined output signal. The second regulator may be coupled to the first regulator and may be configured for receiving the first output signal, and may be configured for outputting a second output signal. The second output signal has a second AC component signal and a second DC component signal. The second output signal may be obtained according to the first output signal. A parameter PSRR of the second regulator may be obtained according to the first AC component signal and the second AC component signal. The digital control unit may be coupled to the function unit, and may be configured for selecting at least one function block or the parameter PSRR measurement block.

In some embodiments, a method for parameter PSRR measurement is disclosed, including: inputting an AC input signal and a DC input signal to a filter; outputting a combined output signal of the filter to a first regulator, the combined output signal obtained according to the AC input signal and the DC input signal; measuring a first output signal of the first regulator, the first output signal having a first AC component signal and a first DC component signal, the first output signal obtained according to the combined output signal; outputting the first output signal of the first regulator to a second regulator; measuring a second output signal of the second regulator, the second output signal having a second AC component signal and a second DC component signal, the second output signal obtained according to the first output signal; and calculating a parameter PSRR of the second regulator according to the first AC component signal and the second AC component signal.

What is claimed is:

1. A circuit for parameter power supply rejection ratio (PSRR) measurement, comprising:
 a filter, having an AC signal input terminal, a DC signal input terminal and a combined signal output terminal, the AC signal input terminal for receiving an AC input signal, the DC signal input terminal for receiving a DC input signal, the combined signal output terminal for outputting a combined output signal according to the AC input signal and the DC input signal;
 a first regulator, having a first input terminal and a first output terminal, the first input terminal coupled to the combined signal output terminal and receiving the combined output signal, the first output terminal for outputting a first output signal having a first AC component signal and a first DC component signal, the first output signal obtained according to the combined output signal; and
 a second regulator, having a second input terminal and a second output terminal, the second input terminal coupled to the first output terminal and receiving the first output signal, the second output terminal for outputting a second output signal having a second AC component signal and a second DC component signal, the second output signal obtained according to the first output signal, a parameter PSRR of the second regulator obtained according to the first AC component signal and the second AC component signal.

2. The circuit for parameter PSRR measurement of claim 1, wherein the filter comprises a resister and a capacitor, the resister is coupled to the capacitor, the combined signal output terminal and the DC signal input terminal, and the capacitor is coupled to the resister, the combined signal output terminal and the AC signal input terminal.

3. The circuit for parameter PSRR measurement of claim 1, wherein the filter comprises a plurality of switches and a plurality of capacitors, the switches are coupled to the capacitors, the DC signal input terminal and the combined signal output terminal, and the capacitors are coupled to the switches, the AC signal input terminal and the combined signal output terminal.

4. The circuit for parameter PSRR measurement of claim 3, wherein the filter comprises a first switch, a second switch, a first capacitor and a second capacitor, the first switch is coupled to the first capacitor, the second switch, and the DC signal input terminal; the second switch is coupled to the first capacitor, the second capacitor, the first switch and the combined signal output terminal; the first capacitor is coupled to the first switch, the second switch, the second capacitor and the AC signal input terminal; the second capacitor is coupled to the second switch, the first capacitor, the combined signal output terminal and the AC signal input terminal.

5. The circuit for parameter PSRR measurement of claim 1, wherein the filter comprises a first resister, a second resister and a capacitor, the first resister is coupled to the capacitor, the second resister, the combined signal output terminal and the DC signal input terminal; the second resister is coupled to the capacitor, the first resister, the combined signal output terminal and a ground, and the capacitor is coupled to the first resister, the second resister, the combined signal output terminal and the AC signal input terminal.

6. The circuit for parameter PSRR measurement of claim 1, wherein the filter comprises an inductor and a capacitor, the inductor is coupled to the capacitor, the combined signal output terminal and the DC signal input terminal, and the capacitor is coupled to the inductor, the combined signal output terminal and the AC signal input terminal.

7. The circuit for parameter PSRR measurement of claim 1, wherein the first regulator is the same as the second regulator.

8. The circuit for parameter PSRR measurement of claim 1, wherein the first regulator and the second regulator are linear regulators.

9. The circuit for parameter PSRR measurement of claim 1, wherein the first regulator and the second regulator are switching regulators.

10. The circuit for parameter PSRR measurement of claim 1, wherein the first output signal is obtained according to the combined output signal and a DC power signal of the first regulator.

11. A semiconductor device for parameter power supply rejection ratio (PSRR) measurement, comprising:
a function unit, having at least one function block and a parameter PSRR measurement block, the parameter PSRR measurement block comprising a filter, a first regulator and a second regulator, the filter for receiving an AC input signal and a DC input signal, and for outputting a combined output signal according to the AC input signal and the DC input signal; the first regulator coupled to the filter, and for receiving the combined output signal, and for outputting a first output signal having a first AC component signal and a first DC component signal, the first output signal obtained according to the combined output signal; the second regulator coupled to the first regulator, and for receiving the first output signal, and for outputting a second output signal having a second AC component signal and a second DC component signal, the second output signal obtained according to the first output signal, a parameter PSRR of the second regulator obtained according to the first AC component signal and the second AC component signal; and
a digital control unit, coupled to the function unit, for selecting at least one function block or the parameter PSRR measurement block.

12. The semiconductor device for parameter PSRR measurement of claim 11, wherein the filter comprises a resister and a capacitor, the resister is coupled to the capacitor.

13. The semiconductor device for parameter PSRR measurement of claim 11, wherein the filter comprises a plurality of switches and a plurality of capacitors, the switches are coupled to the capacitors.

14. The semiconductor device for parameter PSRR measurement of claim 13, wherein the filter comprises a first switch, a second switch, a first capacitor and a second capacitor, the first switch is coupled to the first capacitor, and the second switch; the second switch is coupled to the first capacitor, the second capacitor, and the first switch; the first capacitor is coupled to the first switch, the second switch, and the second capacitor; the second capacitor is coupled to the second switch, and the first capacitor.

15. The semiconductor device for parameter PSRR measurement of claim 11, wherein the filter comprises a first resister, a second resister and a capacitor, the first resister is coupled to the capacitor, and the second resister; the second resister is coupled to the capacitor, and the first resister; and the capacitor is coupled to the first resister, the second resister.

16. The semiconductor device for parameter PSRR measurement of claim 11, further comprising a first output pin and a second output pin, the first output pin is configured for outputting the first output signal, and the second output pin is configured for outputting the second output signal.

17. The semiconductor device for parameter PSRR measurement of claim 11, further comprising a selecting pin for selecting at least one function block or the parameter PSRR measurement block.

18. A method for parameter power supply rejection ratio (PSRR) measurement, comprising:
inputting an AC input signal and a DC input signal to a filter;
outputting a combined output signal of the filter to a first regulator, the combined output signal obtained according to the AC input signal and the DC input signal;
measuring a first output signal of the first regulator, the first output signal having a first AC component signal and a first DC component signal, the first output signal obtained according to the combined output signal;
outputting the first output signal of the first regulator to a second regulator;
measuring a second output signal of the second regulator, the second output signal having a second AC component signal and a second DC component signal, the second output signal obtained according to the first output signal; and
calculating a parameter PSRR of the second regulator according to the first AC component signal and the second AC component signal.

19. The method for parameter PSRR measurement of claim 18, further comprising a step of varying a predetermined frequency of the AC input signal and repeating the steps to calculate the parameter PSRR for desired frequency range.

20. The method for parameter PSRR measurement of claim 18, further comprising a step of inputting a DC power signal to the first regulator, the first DC component signal of the first output signal is obtained according to the DC input signal and the DC power signal.

* * * * *